United States Patent
Yamazaki

(10) Patent No.: US 7,440,643 B2
(45) Date of Patent: Oct. 21, 2008

(54) VARIABLE LIGHT CONTROLLING DEVICE AND VARIABLE LIGHT CONTROLLING METHOD

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/681,688

(22) Filed: Mar. 2, 2007

(65) Prior Publication Data

US 2007/0230856 A1    Oct. 4, 2007

(30) Foreign Application Priority Data

Mar. 30, 2006  (JP) .............................. 2006-094206

(51) Int. Cl.
*G02F 1/295* (2006.01)

(52) U.S. Cl. .................. 385/5; 385/1; 385/2; 385/3; 385/4; 385/8; 385/9; 385/14; 385/39; 385/40; 385/129; 385/140; 372/92; 372/93; 372/94; 372/95; 372/96; 372/97; 372/98; 372/99; 372/109

(58) Field of Classification Search ................. 385/1–5, 385/8, 9, 14–24, 31, 32, 39, 40, 129, 140; 372/92–99, 109
See application file for complete search history.

(56) References Cited

U.S. PATENT DOCUMENTS

| 4,720,160 A * | 1/1988 | Hicks, Jr. .................... 385/31 |
| 6,636,668 B1 * | 10/2003 | Al-hemyari et al. .......... 385/40 |
| 2002/0076149 A1 * | 6/2002 | Deacon ....................... 385/27 |
| 2006/0072866 A1 * | 4/2006 | Mizuno et al. ................ 385/1 |

FOREIGN PATENT DOCUMENTS

| JP | 62-100706 A | 5/1987 |
| JP | 63-281104 A | 11/1988 |
| WO | WO 2005/096462 A1 | 10/2005 |

* cited by examiner

*Primary Examiner*—Brian Healy
*Assistant Examiner*—Hung Lam
(74) *Attorney, Agent, or Firm*—Sughrue Mion, PLLC

(57) ABSTRACT

A variable light controlling device comprising a substrate, an optical waveguide disposed on the substrate, a first heater and a second heater to change the optical waveguide's temperature is fabricated. And a total amount of the power supplied to the first and the second heater, or a total amount of heat emitted from both of the first and second heater, is maintained substantially constant. Then, the substrate is protected from temperature changes, thereby, stable and quick wavelength tuning operations are realized.

4 Claims, 10 Drawing Sheets

VARIABLE LIGHT CONTROLLING DEVICE AND VARIABLE LIGHT CONTROLLING METHOD

BACKGROUND OF THE INVENTION

1. Field of the Invention

Apparatuses and methods consistent with the present invention relate to optical fiber communications devices and, more particularly, to variable light controlling devices and variable light controlling methods for controlling optical characteristics variably on the basis of thermo-optic effects.

2. Description of the Related Art

In Wavelength Division Multiplex (WDM) optical communications, the need for a technique for tuning the wavelength of light signals is becoming important as Add Drop Multiplex (ADM) and other functions are enhanced more and more. At present, to realize this technique, wavelength variable devices are employed. As an example of one of such devices, there is provided a wavelength tunable filter for transmitting or blocking optical signals having a particular wavelength. In the related art, as shown in Japanese Patent Laid-Open Application No. 1988-281104, and Japanese Patent Laid-Open Application No. 1987-100706, a thermo-optic effect type filter is proposed. These thermo-optic effect type filters include resonators formed on a substrate, by using a silica waveguide processing technique. And, as shown in PCT application WO 2005/096462, there is another related art device which is a wavelength tunable laser for outputting optical signals having a particular wavelength. PCT application WO 2005/096462 shows a device in which an external resonator is composed by a thermo-optic effect filter type resonator and a semiconductor optical amplifier (SOA).

In the case of the related art wavelength variable devices, as described above, plural elements as well as resonators can be manufactured together in a silica waveguide process. Therefore, the characteristics of such related art devices are determined by an accuracy of masks and processing that are employed. The characteristics of the devices which are manufactured by optical waveguide processes which adopt an accurate mask and accurate processing are stabilized and desired characteristics are obtained easily. Because such devices have excellent characteristics, such devices are expected to be developed more and more in the future.

In any of the above related art devices, tuning wavelength is realized by heating a waveguide, which has thermo-optic effects, with a heater to change the temperature of the waveguide. However, when heating the waveguide, the following problems arise. For example, when the heater is powered to heat the waveguide, the temperature of the substrate is also changed at the same time. Generally, the temperature of the substrate is controlled to be constant by using a thermistor and a peltier element to stabilize the temperature of other elements. Therefore, when the temperature of the substrate is changed due to the heater, which is used to change the temperature of the waveguide, the thermistor detects the temperature change and the peltier element is driven to stabilize the temperature of the substrate. This series of operations by the thermistor and the peltier element generally takes about 10 seconds. And, the wavelength is not stabilized until the temperature of the substrate is stabilized. Therefore, the related art devices discussed above need extra time to vary and stabilize the wavelength. Thus, all of the related art devices discussed above have a problem in that they cannot perform quick wavelength tuning operations (quick responses to wavelength tuning) within a time frame of 0.1 seconds to one second, which is needed for ADM functions, etc.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

Aspects of the present invention are directed to providing a variable light controlling device and a variable light controlling method for realizing a quick wavelength tuning operation. Aspects of the present invention are realized by shortening the time during which optical characteristics are stabilized when the wavelength varies on the basis of thermo-optic effects.

Consistent with the present invention, a variable light controlling device comprises a substrate, an optical waveguide disposed on the substrate, a first heater disposed closely to the optical waveguide, and a second heater disposed separately from the first heater. And, a total amount of the power supplied to the first and second heater is maintained substantially constant.

According to another aspect of the present invention, the variable light controlling device comprises a substrate, an optical waveguide disposed on the substrate, a first heater disposed closely to the optical waveguide, and a second heater disposed separately from the first heater. And, a total amount of the heat emitted from the first and second heater is maintained substantially constant.

The variable light controlling method of the present invention, which is used for the variable light controlling device provided with a substrate and an optical disposed on the substrate, includes a first heating step for heating the optical waveguide and a second heating step for heating the substrate. And, a total amount of the power supplied in the first and second heating steps is maintained substantially constant. Each of the variable light controlling device and the variable light controlling method of the present invention may comprise a second heater for heating the substrate separately from the first heater for heating the optical waveguide having a thermo-optic effect. And, the increase/decrease of the power or heat in the first heater is compensated for by the second heater, thereby a total amount of the power/heat supplied/emitted to/from first and second heater is maintained substantially constant. Consequently, even when the power supplied to the first heater changes significantly at the time of a tuning operation, the temperature of the whole substrate does not change significantly. Therefore, aspects of the present invention are effective to shorten the time during which optical characteristics are stabilized when the wavelength varies on the basis of thermo-optic effects, thereby realizing quick wavelength tuning operations.

BRIEF DESCRIPTION OF THE DRAWINGS

The aspects of the present invention will become more apparent by describing in detail exemplary embodiments thereof with reference to the accompanying drawings, in which:

As shown in FIG. 10, (1) denotes a spectrum of a small diameter ring resonator, (2) denotes a spectrum of a large diameter ring resonator, and (3) denotes a synthesized spectrum of the spectra of the small diameter ring resonator illustrated by (1) and the large ring resonator illustrated by (2).

DETAILED DESCRIPTION OF EXEMPLARY EMBODIMENTS OF THE PRESENT INVENTION

According to an exemplary embodiment of the present invention, a variable light controlling device comprises a substrate, an optical waveguide having a thermo-optic effect, which is disposed on the substrate, a first heater disposed closely to the optical waveguide, and a second heater disposed separately from the first heater. According to the exemplary embodiment under discussion, a total amount of power supplied to the first and second heater is maintained substantially constant.

According to another exemplary embodiment of the present invention, the variable light controlling device comprises a substrate, an optical waveguide having a thermo-optic effect, which is disposed on the substrate, a first heater disposed closely to the optical waveguide, and a second heater disposed separately from the first heater. According to the exemplary embodiment under discussion, a total amount of the heat emitted from the first and second heater is maintained substantially constant. Consequently, even when the power supplied to the first heater changes significantly at the time of a tuning operation, the temperature of the whole substrate does not change significantly.

Therefore, exemplary embodiments of the present invention are effective to shorten the time during which optical characteristics are stabilized when the wavelength varies on the basis of thermo-optic effects, thereby realizing quick wavelength tuning operations.

Various exemplary embodiments of the present invention are explained below in detail with reference to the attached drawings. Although exemplary embodiments are mentioned below, the scope of the present invention is not limited to these exemplary embodiments but is defined only by the appended claims.

First Exemplary Embodiment

Figure 1:
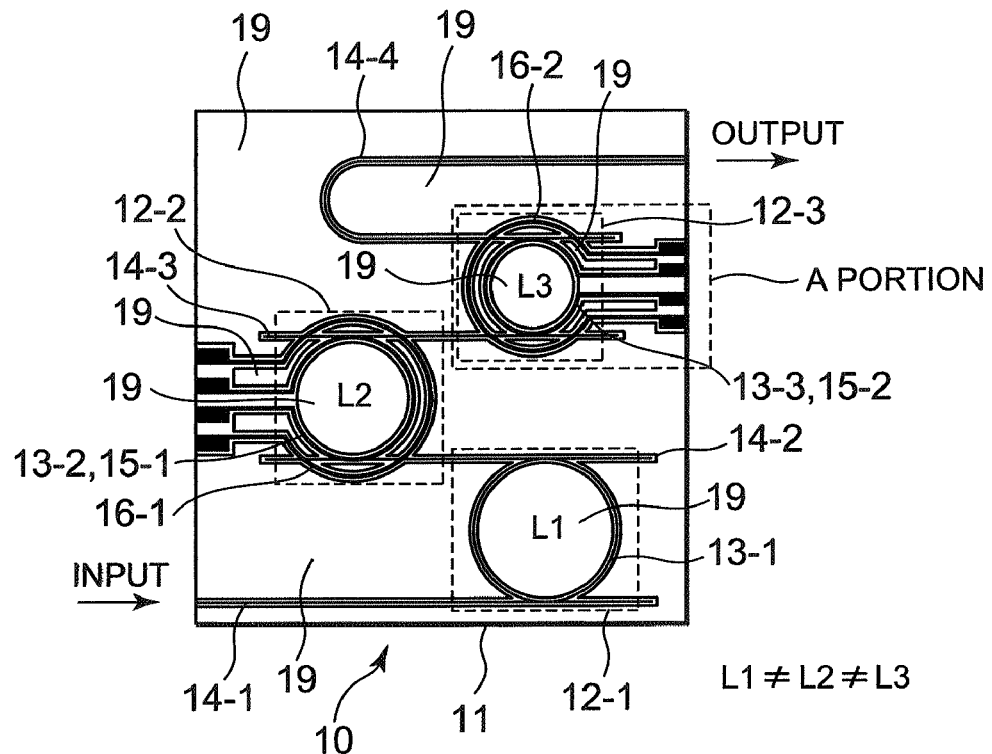
FIG. 1 is a top view of a wavelength tunable filter according to a first exemplary embodiment of the present invention.
Figure 2:
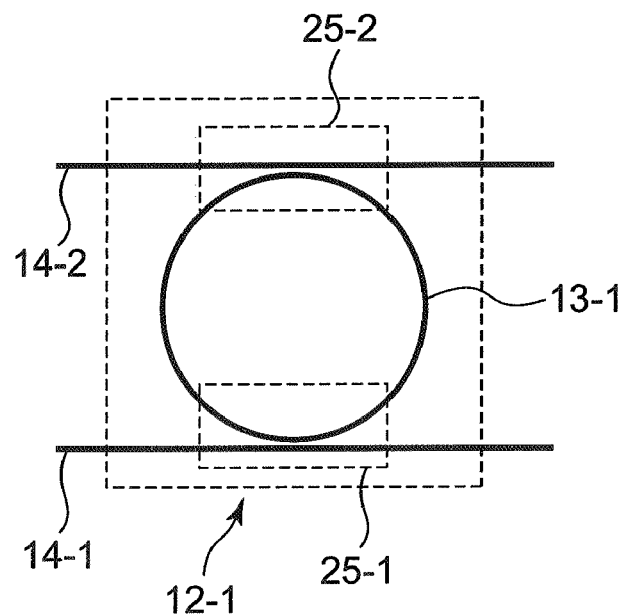
FIG. 2 is an expanded view of a ring resonator consistent with an exemplary embodiment of the present invention.

A structure of a wavelength tunable filter according to a first exemplary embodiment of the present invention is described as follows. FIG. 1 shows a top view of the wavelength tunable filter according to the first exemplary embodiment of the present invention. This wavelength tunable filter 10 comprises ring resonators 12-1, 12-2, and 12-3 on a substrate 11. The ring resonators 12-1, 12-2, and 12-3 comprise ring waveguides 13-1, 13-2, and 13-3 respectively. Furthermore, the wavelength tunable filter 10 also comprises input/output waveguides 14-1, 14-2, and 14-3 disposed so as to dispose each ring waveguide therebetween. An optical coupler is formed at each portion where one of the ring waveguides and one of the input/output waveguides are closest to each other and those optical couplers are optically connected to each other. FIG. 2 shows and an expanded view of the ring resonator 12-1 that is shown in FIG. 1. Consistent with this exemplary embodiment, each optical coupler is composed of directional couplers 25-1 and 25-2. Instead of such directional couplers, each optical coupler may be composed of a multi-mode interferometer (MMI), a Mach-Zehnder interferometer, or the like.

The ring waveguides 13-1, 13-2, and 13-3 are set to different Free Spectral Ranges (FSRs) and have different ring lengths (i.e., circumferential lengths), respectively. The relationship between FSR and ring length among the ring waveguides is represented by the following Expression (1):

$$FSR = c/(n \times L) \qquad (1)$$

where, c is the speed of light, n is an equivalent refractive index, and L is a ring length (circumferential length).

Consistent with this exemplary embodiment, the ring waveguide 13-1 is designed in accordance with a desired grid wavelength, for example, the International Telecommunication Union-Telecommunication (ITU-T) grid wavelength in the object wavelength multiplex light transmission system. The ring waveguide 13-2 is provided for rough adjustment of wavelength tuning operations. And, the ring waveguide 13-3 is provided for fine adjustment of wavelength tuning operations. For example, the ring length L1 of the ring waveguide 13-1 is 4,000 μm (micrometers), the ring length L2 of the ring waveguide 13-2 is 4,400 μm, and the ring length L3 of the ring waveguide 13-3 is 4,040 μm. By changing an object ring length in such way, ring resonators having different FSRs, respectively, are provided. The arrangement of the ring resonators can be changed in a desired order. Although three resonators are provided in FIG. 1, four or more resonators may be provided to improve adjustment accuracy. Moreover, a wavelength tunable filter can be realized by only two resonators by reducing the number of resonators for adjustment. Further, in another example, a wavelength tunable filter can be realized by only one resonator. In other words, a wavelength tunable filter can be realized consistent with the present invention by any number of resonators.

Figure 3:
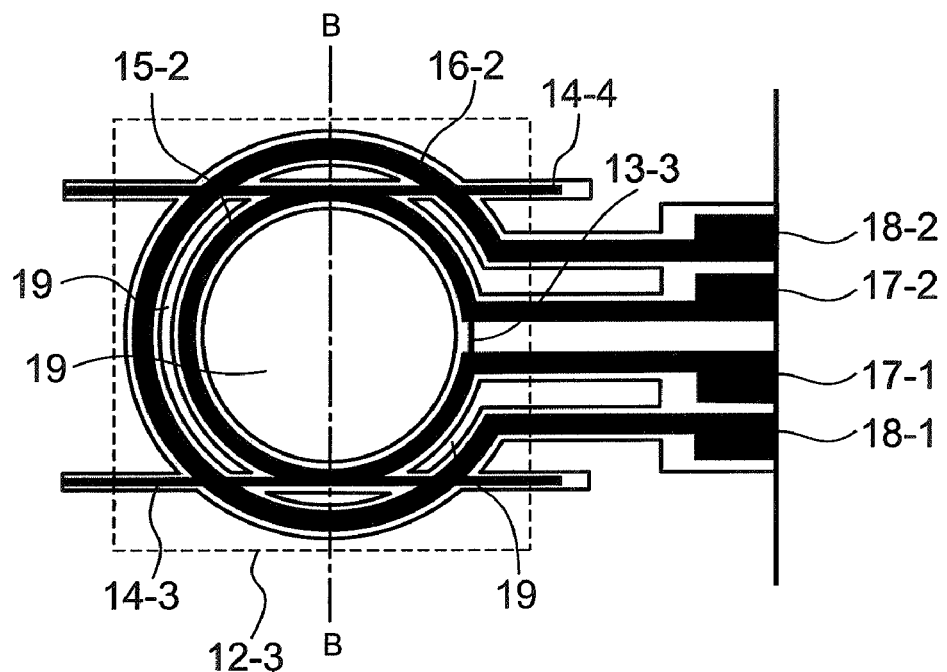
FIG. 3 is an expanded view of the A portion shown in FIG. 1.

On the upper parts of the ring waveguides 13-2 and 13-3, thin-film-like heaters 15-1 and 15-2 are provided, respectively. And thin-film-like dummy heaters 16-1 and 16-2 are provided around the thin-film-like heaters 15-1 and 15-2, respectively. An example of the ring waveguide 13-3 is described below. The ring waveguide 13-2 is the same in structure as the ring waveguide 13-3. FIG. 3 shows an expanded view of the A portion of the ring waveguide 13-3 shown in FIG. 1. The heater 15-2 and the dummy heater 16-2 of the ring waveguide 13-3 are disposed with a space therebetween and an insulation groove 19 is formed in the space. The heater 15-2 is provided with heater pads 17-1 and 17-2, and the dummy heater 16-2 is provided with dummy heater pads 18-1 and 18-2. The heater and dummy heater pads are used to supply power to the heater and dummy heaters, respectively. A total amount of the power supplied to the heater 15-2 and the dummy heater 16-2 is maintained substantially constant. In the same way, the ring waveguide 13-2 in FIG. 1 is also provided with a heater 15-1 and a dummy heater 16-1. And, an insulation groove 19 is formed between the heater 15-1 and the dummy heater 16-1.

Figure 4:
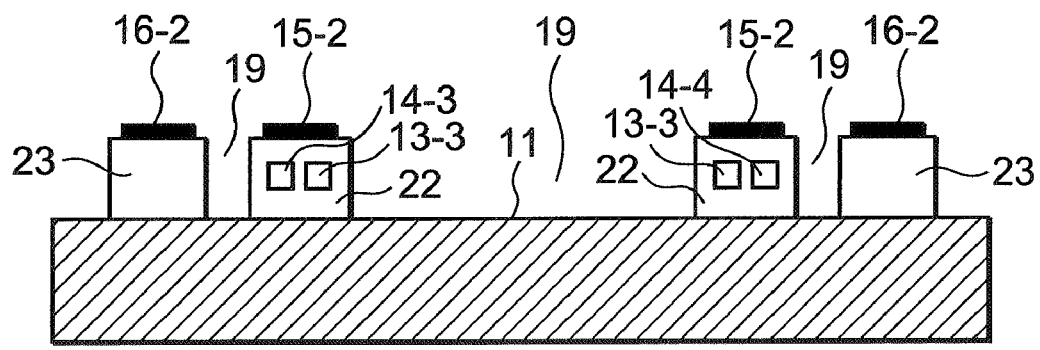
FIG. 4 is a cross sectional view of the A portion taken along the line B-B shown in FIG. 3.

Next, a positional relationship between each heater and each dummy heater will be described in detail with reference to the attached drawings. FIG. 4 shows a cross sectional view along the line B-B shown in FIG. 3. On the substrate 11, a clad 22 and a dummy clad 23 are formed. And, an insulation groove 19 is formed between the clad 22 and the dummy clad 23. Inside the clad 22, cores of the ring waveguide 13-3 and of the input/output waveguides 14-3 and 14-4 are formed. And, on the upper parts of the clad 22, a heater 15-2 is formed. As shown in FIG. 4, the clad 22 is formed like a stripe, that is, a so-called mesa-type clad with respect to the substrate 11. On the other hand, on the upper parts of the dummy clad 23, a dummy heater 16-2 is formed, and inside the dummy clad 23, no waveguide core is formed. As described above, the heater 15-2 is disposed so as to heat the waveguide cores efficiently. The dummy heater 16-2 is disposed separately from the waveguide cores so as not to heat the waveguide cores. The width of the insulation grooves 19 is, for example, about 100 µm (micrometers). Even when the width of the insulation grooves 19 is a few µm or more, the insulation grooves 19 are effective. The depth of the insulation grooves 19 may reach to the top face of the substrate 11. For example, the height of the clads and dummy clads is about 10 µm and the width of the clads and dummy clads is about 10 µm. The width of the heaters and dummy heaters is roughly a few µm. Other heaters and dummy heaters are structured in a similar manner.

As shown in FIG. 3, the dummy heater 16-2 is disposed outside the heater 15-2. This structure enables the heater 15-2 to cover the long circumference of the ring waveguide 13-3. Thus, the power consumption of the heater 15-2 is reduced. However, the dummy heater may also be disposed inside the heater 15-2. As shown in FIG. 3, the dummy heater 16-2 is disposed closely and parallel to the heater 15-2. However, consistent with the present invention, the dummy heater 16-2 need not be disposed closely to the heater 15-2 in such way. The shapes of the dummy heater 16-2 and the dummy heater 15-2 are similar to each other. However, the shapes of the dummy heater 16-2 and the dummy heater 15-2 may be different from each other. If the dummy heater 16-2 and the heater 15-2 are disposed closely to each other, as shown in FIG. 3, such an arrangement is effective to eliminate differences of the heat to be applied to the substrate 11 from the heaters 16-2 and 15-2. Consequently, the distribution of the heat applied to the substrate 11 from the heaters 15-2 and 16-2 can be made almost even regardless of how much power is supplied to the heater 15-2 and the dummy heater 16-2, respectively. Thus, the temperature distribution of the substrate 11 is maintained substantially constant. And, accordingly, the thermal design can be made more easily. If the dummy heater 16-2 and the heater 15-2 are disposed symmetrically to the substrate 11, the symmetry of the heat applied to the substrate 11 can be maintained. This enables the substrate 11 to be protected effectively from the influence of thermal differential operations. Furthermore, if the shapes of the dummy heater 16-2 and the heater 15-2 are similar to each other, thermal differences that might occur on the substrate 11 can be reduced. Thus, the changes of the heat from the heater 15-2 can be compensated for more easily and the waveguide heating process can thereby be operated more stably. The relationship between other heaters and dummy heaters, shown in FIG. 1, are the same as the relationship between the heater 15-2 and the dummy heater 16-2, respectively.

As the material of the substrate 11, silicon, various types of glass such as silica glass, borosilicate glass, etc., as well as various types of polymer resin such as polyimide, etc., can be used. The preferable materials are those materials that do not cause temperature slopes so easily, that can disperse the heat from the heaters and from the dummy heaters all over the substrate 11 efficiently, and that have high thermal conductivity, but such materials are not necessarily required. Silicon is one illustrative, but non-limiting example of such preferable materials. As described above, the ring waveguides 13-1, 13-2 and 13-3 and the input/output waveguides 14-1, 14-2, 14-3 and 14-4 are formed on the substrate 11 in a silica-based optical waveguide process. The cores of the ring waveguides and the input/output waveguides are manufactured by adding an additive such as germanium (Ge) to silica glass to make the refractive index higher than the clads. Heaters and dummy heaters are formed in an evaporation process with a metallic thin film made of platinum, chrome, gold, or the like, or with a compound thin film made of nitride, such as tantalum nitride (TaN), oxide, or the like.

Figure 5:
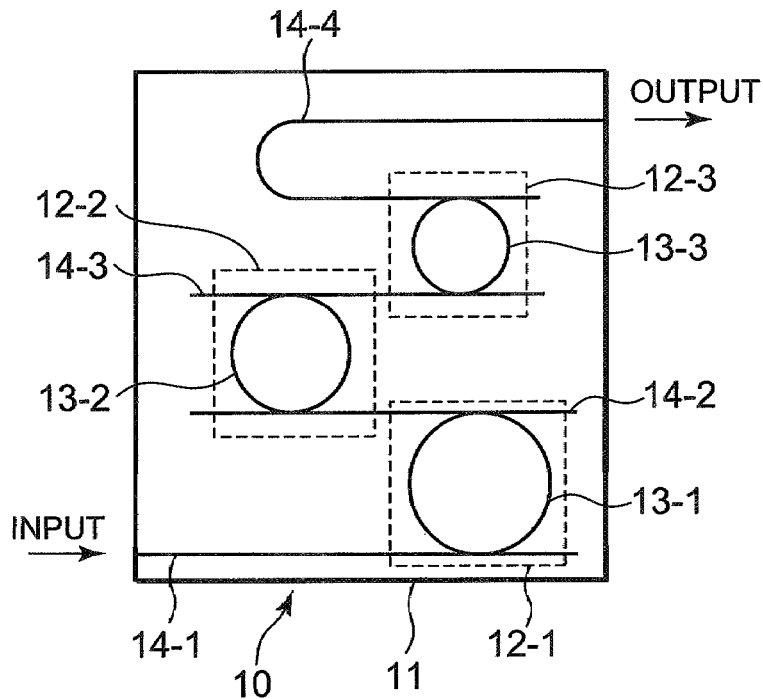
FIG. 5 is a top view showing how cores are formed consistent with an exemplary embodiment of the present invention.
Figure 6:
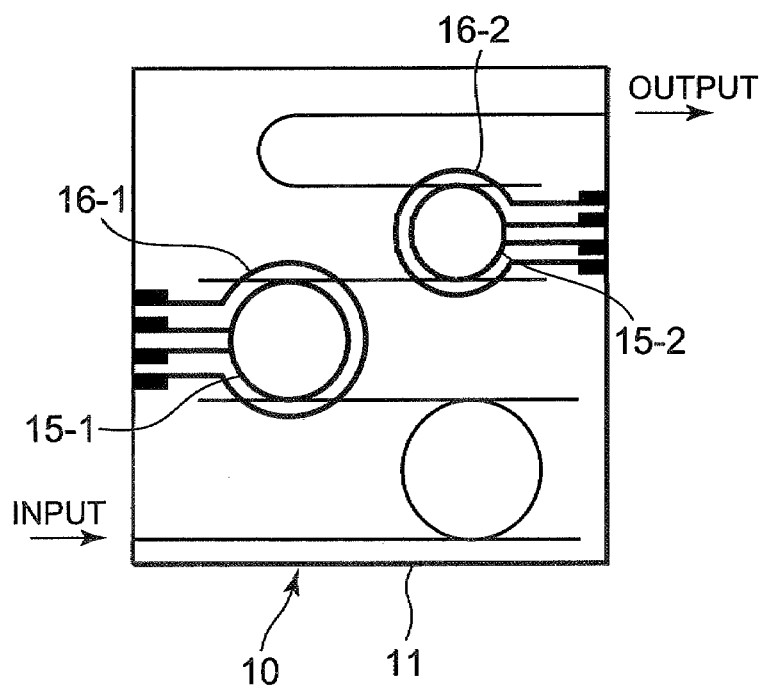
FIG. 6 is a top view showing how heaters are formed consistent with an exemplary embodiment of the present invention.
Figure 7:
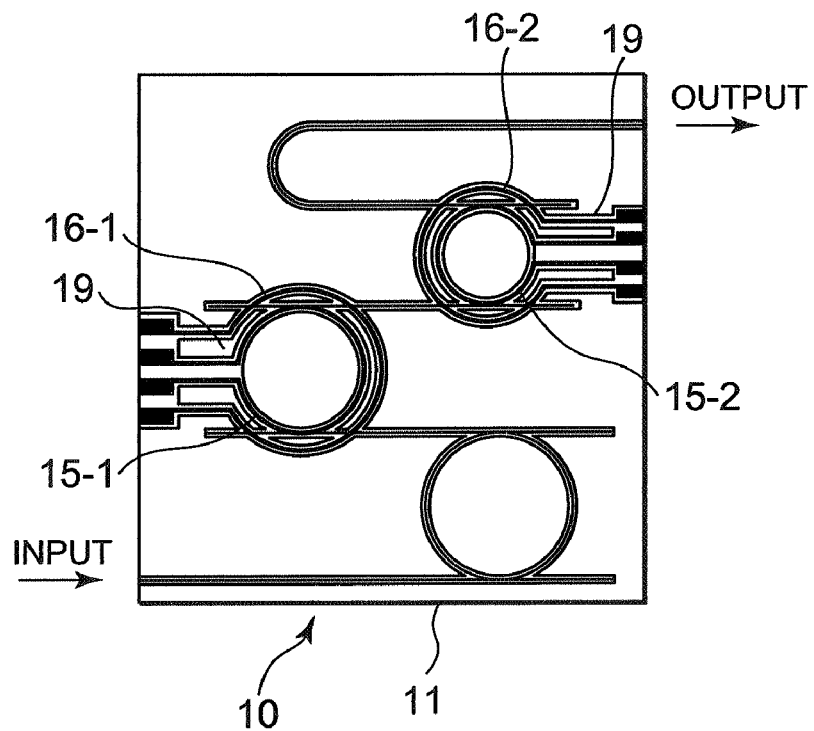
FIG. 7 is a top view showing how insulation grooves are formed consistent with an exemplary embodiment of the present invention.
Figure 8:
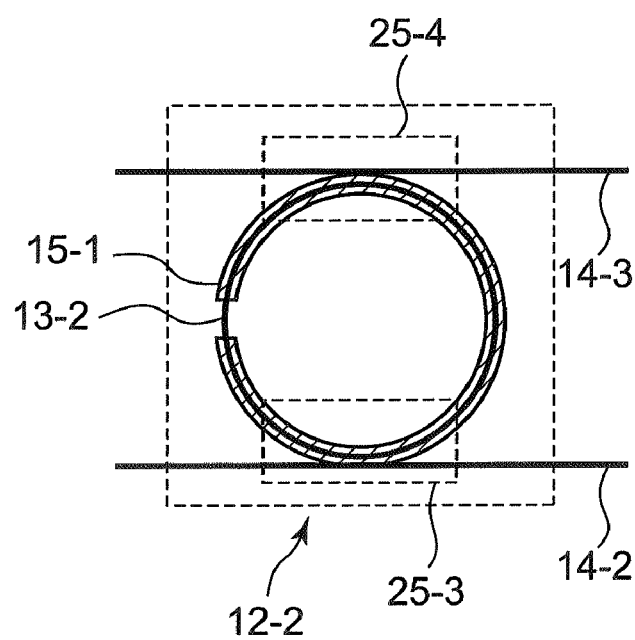
FIG. 8 is an expanded view showing how a heater is formed consistent with an exemplary embodiment of the present invention.

Next, manufacturing processes of the wavelength tunable filter 10 are described briefly below, with reference to FIG. 5, FIG. 6 and FIG. 7. At first, a silica glass film is deposited on the substrate 11 with a chemical vapor deposition (CVD) method or the like, and then the lower clad portion is formed thereon. After that, a silica glass film to which Ge, etc. are added is deposited on the lower clad portion, for example, with the CVD method and the cores (13-1, 13-2 and 13-3 and 14-1, 14-2, 14-3 and 14-4) that transfer light are formed as shown in FIG. 5. Then, as shown in FIG. 6, the heaters 15-1 and 15-2 and the dummy heaters 16-1 and 16-2 are formed over the cores, for example, in an evaporation process. Finally, the cladding layers are removed using masks in an etching process to form the insulation grooves 19 as shown in FIG. 7. Then, as shown in FIG. 8 (top view of the ring resonator 12-2), the heater 15-1 is disposed to cover the circumference of the ring waveguide 13-2 almost entirely. The heater 15-2 is also disposed in the same way. Consistent with the present invention, the etching process described above may be dry etching, for example, with a Reactive Ion Etching (RIE) method.

Figure 9:
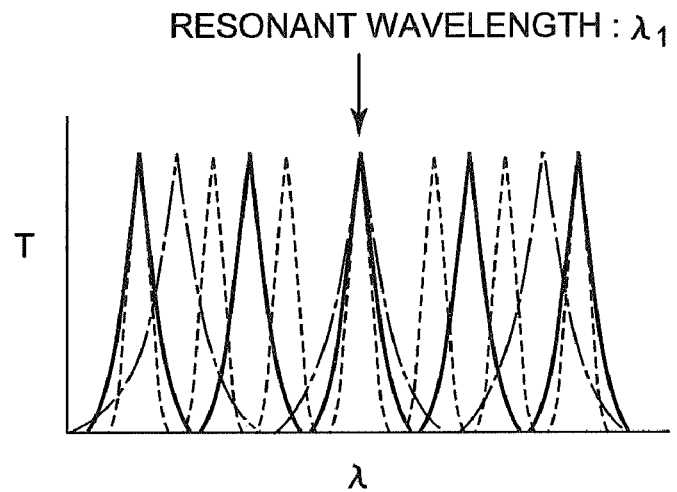
FIG. 9 is a graph describing a resonance operation caused by a resonant spectrum having three types of Free Spectral Ranges (FSRs) consistent with an exemplary embodiment of the present invention.

Next, an operation of the wavelength tunable filter according to the first exemplary embodiment of the present invention is described below with reference to FIG. 1 and FIG. 5. At first, with reference to FIG. 1 and FIG. 5, an optical signal having a particular wavelength is inputted to an input/output waveguide 14-1 from the lower left side (INPUT) of the substrate 11, that is, the optical signal is input in the right direction as shown in FIG. 1 and FIG. 5. The inputted optical signal is transferred sequentially to the input/output waveguide 14-1, then to the ring waveguide 13-1, then to the input/output waveguide 14-2, then to the ring waveguide 13-2, then to the input/output waveguide 14-3, and then to the ring waveguide 13-3 through optical couplers. Then, the optical signal is output from the ring waveguide 13-3 to the input/output waveguide 14-4, that is, the optical signal is output in the left direction as shown in FIG. 1 and FIG. 5. The output optical signal is transferred to the upper right side of the substrate 11 through a curved portion of the input/output waveguide 14-4. Finally, the optical signal is output from the right side (OUTPUT) of the substrate 11. The ring lengths (i.e., circumferential lengths) of the ring waveguides 13-1, 13-2 and 13-3 are different, respectively, as described above. The resonant spectra of the ring resonators 12-1, 12-2 and 12-3 thus differ from each other in FSR (i.e., resonant peak wavelength interval). FIG. 9 shows resonant operations caused by a resonant spectrum having three types of FSRs. By using plural resonators having different FSRs, respectively, a wavelength ($\lambda1$) in which resonant peak wavelengths match with each another is obtained. And, optical signals having such a wavelength ($\lambda1$) strengthen each another by those resonators. Accordingly, the optical signals having the wavelength ($\lambda1$) strengthen each other selectively and then such strengthened signals are output. Thus, this device functions as a wavelength filter.

Next, a wavelength tuning operation is described, below. As shown in FIG. 1, when the heaters 15-1 and 15-2, which are provided over the ring waveguide 13-2 or the ring waveguide 13-3, are powered, the temperature of each waveguide changes. In a silica-based optical waveguide having a thermo-optic effect, when the temperature of the waveguide changes, the refractive index of the waveguide also changes. As a result, the optical pass length of the ring waveguide changes. Accordingly, the resonant peak wavelength of the ring resonator changes. Thus, if the temperature of a ring waveguide rises, the waveguide's equivalent refractive index also rises and the resonant spectrum is shifted toward a longer wavelength direction. Consequently, the resonant peak wavelength is also shifted toward the longer wavelength direction. On the other hand, if the temperature of a ring waveguide falls, the waveguide's equivalent refractive index also falls and the resonant spectrum is shifted toward the shorter wavelength direction. Consequently, the resonant peak wavelength is shifted toward the shorter wavelength direction. This thermo-optic effect can be used to shift the resonant peak wavelength of each of the other ring resonators 12-2 and 12-3 toward the longer wavelength direction or the shorter wavelength direction according to the resonant peak wavelength of the ring resonator 12-1. Consequently, each matching resonant peak wavelength changes.

Figure 10:
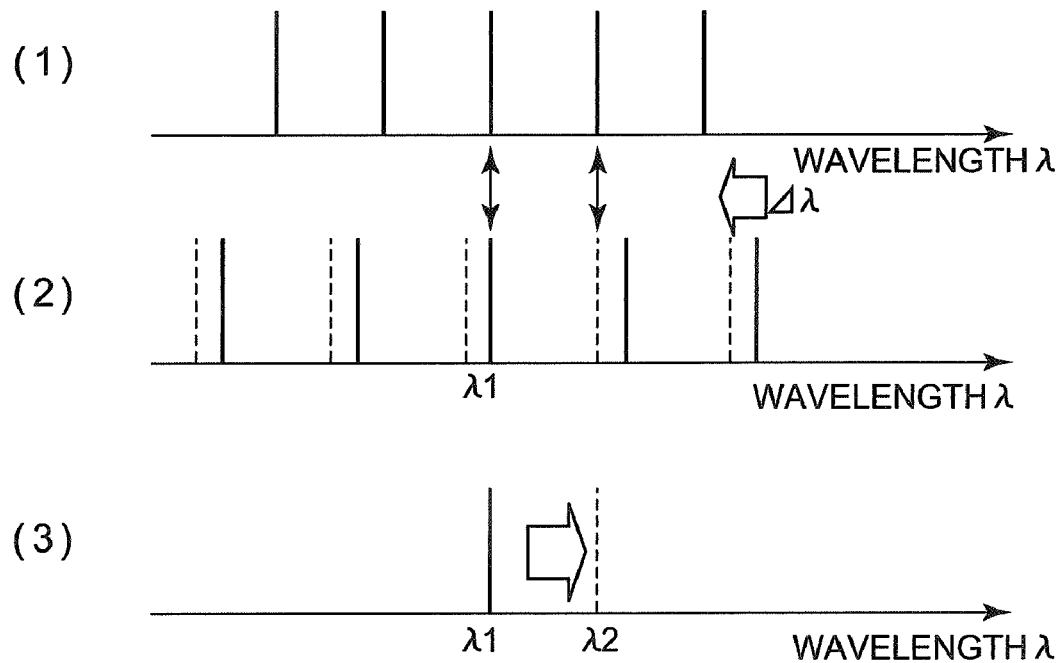
FIG. 10 is a graph describing principles of wavelength tuning by a plurality of ring resonators consistent with an exemplary embodiment of the present invention.

FIG. 10 shows principles of the wavelength tuning operations by a plurality of ring resonators. Hereinafter, the wavelength tuning operations of only two exemplary ring resonators is described to simplify the description. As shown in FIG. 10, (1) denotes the spectrum of a small diameter ring resonator. And, as shown in FIG. 10, (2) denotes the spectrum of a large diameter ring resonator. As shown in (2), a solid line refers to a time before a wavelength change, and a dotted line refers to a time after a wavelength change. Moreover, as shown in FIG. 10, (3) denotes a synthesized spectrum of the spectra of the aforementioned small diameter ring resonator and the aforementioned large diameter ring resonator illustrated by (1) and (2), respectively. As shown in (1) and (2), the intervals of many resonant peak wavelengths that appear periodically differ slightly from each another. In the constant state, as shown by solid line in (3), the wavelength $\lambda1$ is resonating. If the power supplied to the heater disposed in the large diameter ring resonator is reduced to lower the temperature, the waveguide's equivalent refractive index of the waveguide decreases. Consequently, the spectrum of the ring resonator in (2) is shifted entirely toward the shorter wavelength direction as shown by a dotted line. As a result, the peak wavelength matching between (1) and (2) changes from $\lambda1$ to $\lambda2$, as shown in (3). Accordingly, the wavelength $\lambda2$, which is shown by a dotted line in (3), begins resonating. In such a manner, the resonant wavelength can be changed from $\lambda1$ to $\lambda2$. The wavelength tuning operation is realized because the wavelength interval is deviated among each ring resonator. Such a wavelength tuning operation invokes the same principles as those of slide clippers and vernier effects. Accordingly, wavelength tuning can be made in a wider dynamic range than when only one ring resonator is used. Furthermore, consistent with this exemplary embodiment, in addition to the ring resonator 12-2, which is used for rough adjustment, the ring resonator 12-3, which is used for fine adjustment, is provided, thereby enabling wavelength tuning at higher accuracy.

The wavelength tunable filter 10 according to the first exemplary embodiment, as shown in FIG. 3, is provided not only with a heater 15-1, but also with a dummy heater 16-1. Consequently, if the power supplied to the heater 15-1 increases (i.e., when the amount of heat from the heater 15-1 increases) due to a wavelength tuning operation, the power supply to the dummy heater 16-1 is reduced (i.e., the amount of heat is reduced). On the other hand, if the power supplied to the heater 15-1 decreases (i.e., if the amount of heat from the heater 15-1 decreases), the power supply to the dummy heater 16-1 is increased (i.e., the amount of heat is increased). In such a manner, the heater 15-1 and the dummy heater 16-1 are operated differentially in accordance with the expression (2) below:

$$Ph + Pd = \text{Constant} \quad (2)$$

Where, Ph is a power applied to the heater, and Pd is a power applied to the dummy heater.

Even when the power applied to the heater 15-1 changes significantly, a total amount of the power supplied to the substrate 11 or a total amount of heating is maintained substantially constant. Consequently, the temperature of the substrate 11 is maintained substantially constant.

Next, the process by which the heat from the heater 15-2 and the dummy heater 16-2 is transferred is described with reference to FIG. 4. The heater 15-2 is disposed over the clad 22, in which the cores 13-3, 14-3, and 14-4 are formed. Consequently, the heat from the heater 15-2 can be transferred efficiently to the cores 13-3, 14-3, and 14-4. On the other hand, the dummy heater 16-2 is disposed over the dummy clad 23, in which no core is formed. In addition, an insulation groove 19 is formed between the clad 22 and the dummy clad 23. Thus, the insulation groove 19 forms an air layer generating high heat isolation between the clad 22 and the dummy clad 23. Consequently, the heat from the dummy heater 16-2 is not transferred to the cores easily. As such, the heat from the heater 15-2, after heating the clad 22 and the cores 13-3, 14-3, and 14-4, is transferred to the substrate 11.

The substrate 11 is formed with a high heat conductivity material. Thus, the heat is quickly dispersed throughout the substrate 11. Moreover, the heat from the dummy heater 16-1, after heating the clad 23, is transferred to the substrate 11 in the same way. But, since the substrate 11 is formed with a high heat conductivity material, the heat is quickly dispersed throughout the substrate 11 and is hardly transferred to the adjacent clad 22. If the substrate 11 is formed with silicon and the clads are formed with silica glass, the heat conductivity of the clads differs by $1\times10^{-2}$. That is, the heat conductivity of silicon substrates is about 150 W/(m·K) and that of silica glass substrates is about 1.5 W/(m·K). This is why the heat that is transferred to the substrate 11 is not transferred to the clads so easily. Because the substrate 11 functions like a heat sink, the heat from the dummy heater 16-1 is not transferred to the cores so easily.

In the wavelength tunable filter structured as described above, the ring waveguides 13-2 and 13-3 are provided with a heater and a dummy heater, respectively, while the ring waveguide 13-1, the wavelength of which is adjusted to the reference wavelength, is not provided with any heater. However, according to the present invention, all the ring waveguides including the ring waveguide 13-1 may be provided with a heater and a dummy heater, respectively. In such a case, if the wavelength of the ring waveguide 13-1 deviates from the reference wavelength, then such a deviation can be compensated for by adjusting the temperature of the ring waveguide 13-1.

Figure 11:
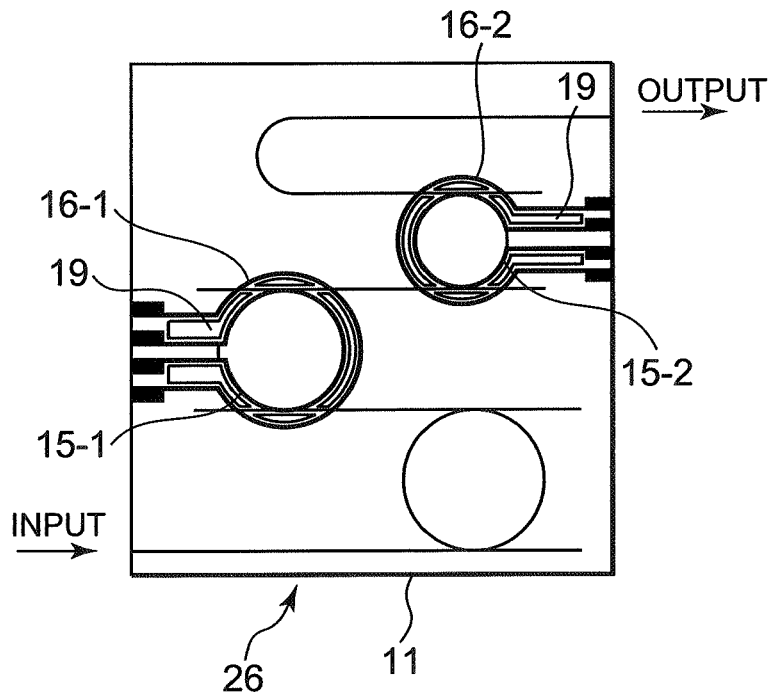
FIG. 11 is a top view of a wavelength tunable filter in a variation of the first exemplary embodiment of the present invention.

Next, a variation of the first exemplary embodiment of the present invention is described below. FIG. 11 shows a top view of a variation of the first exemplary embodiment of the present invention. In this exemplary embodiment, unlike the exemplary embodiment shown in FIG. 1, insulation grooves 19 are formed only between the heater 15-1 and the dummy heater 16-1 and between the heater 15-2 and the dummy heater 16-2. Thus, the wavelength tunable filter 26 is structured so that other flat portions are covered by clads. Thus, the insulation grooves 19 may be formed only in necessary portions in such a manner. On the other hand, insulation grooves may be formed not only between heaters and dummy heaters, respectively, but may also be formed at the outer peripheral places of the heaters and dummy heaters. Consequently, the power consumption of each heater can be lowered because the outer peripheral grooves prevent heat from spreading to unnecessary parts of the device.

Next, effects of the wavelength tunable filter according to the first exemplary embodiment of the present invention are described. As described above, in the wavelength tunable filter according to this first exemplary embodiment, even when power or heat supplied to/emitted from a heater changes, such a change is compensated for by its corresponding dummy heater, and accordingly the substrate is not affected by the change at all. Consequently, the substrate is protected from temperature changes and, thereby, stable wavelength tuning operations are realized.

And, because an insulation groove (air layer) is provided between each heater and each dummy heater, the heat from the dummy heater is not transferred to the cores so easily.

Further, if a clad in which cores are formed is formed like a stripe, that is, a so-called mesa-type clad, the heat from the dummy heater is not transferred to the cores so easily.

And, if the substrate is formed with a high heat conductivity material, then the heat emitted from a dummy heater is dispersed throughout the substrate quickly and, thus, such heat is not transferred to the clad in which cores are formed so easily. Accordingly, the substrate functions like a heat sink, so that the heat from the dummy heater is not transferred to the cores so easily.

And, if a heater covers the circumference of a ring waveguide entirely, the power consumption of the heater is reduced effectively because the heat from the heater reaches the ring waveguide effectively.

Further, if a dummy heater is disposed closely to its corresponding heater, the heat distribution difference in the substrate, between a time before and a time after the heat supply from those heaters, becomes smaller. Thus, thermal design can be made more easily.

Moreover, if a heater and a dummy heater are disposed symmetrically with respect to the substrate, that is, so as to dispose a dummy heater on the backside of the substrate, the symmetry of the heat applied to the substrate is maintained. And, accordingly, the substrate is not affected by thermal differences so much. Furthermore, if a dummy heater and a heater are formed similarly in shape, the differences of the heat applied to the substrate are further reduced. If a dummy heater is structured, as described above, thermal changes of the heater are compensated for more easily and the substrate operation thereby becomes more stable.

And, if the wavelength tunable filter is provided with a first ring waveguide for rough adjustment and a second ring waveguide for fine adjustment with respect to wavelength tuning operations, wavelength adjustment can be made more precisely.

Additionally, if every ring waveguide is provided with a heater and a dummy heater, thermal changes can be compensated for even when the wavelength of the device itself deviates from the reference wavelength.

Second Exemplary Embodiment

Figure 12:
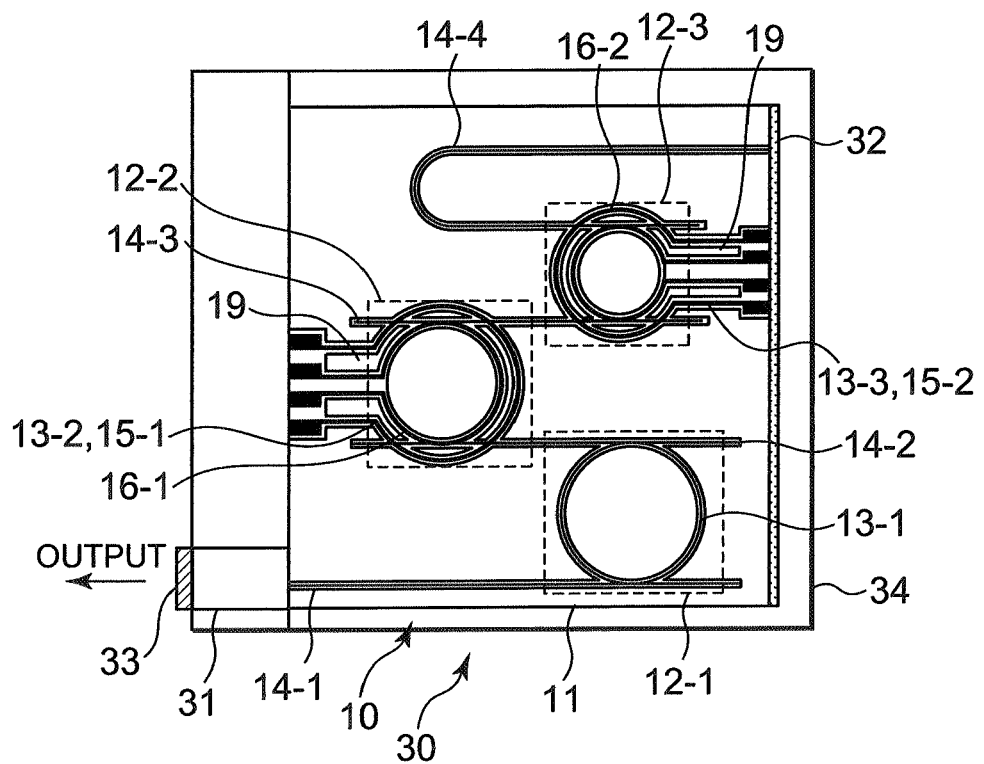
FIG. 12 is a top view of a wavelength variable light source according to a second exemplary embodiment of the present invention.

Hereinafter, a construction of a wavelength variable light source consistent with a second exemplary embodiment of the present invention is described. FIG. 12 shows a top view of the wavelength tunable light source 30 according to the second exemplary embodiment of the present invention. In FIG. 12, the same reference numerals are used to refer to the same components as those in the first exemplary embodiment so as to avoid redundancy. The wavelength tunable light source 30 according to this second exemplary embodiment is provided with the wavelength tunable filter 10 employed in the first exemplary embodiment and is disposed on a substrate 34. Further, a semiconductor optical amplifier 31 is disposed at the lower left side of the substrate 34. At the left side of the semiconductor optical amplifier 31, a low reflection coating 33 is formed. At the right side of the substrate 11, a high reflection coating 32 is formed. The semiconductor optical amplifier 31 and an input/output waveguide 14-1 of the substrate 11 are directly connected to each other (i.e., Butt-coupled). A non-reflection coating is applied to the coupled portion as needed. The substrate 34 functions as a common platform of the substrate 11 and the semiconductor optical amplifier 31. The disposed locations of the high reflection coating 32 and the low reflection coating 33 may be exchanged. For instance, the low reflection coating may be formed at the right side of the substrate 11 and the high reflection coating may be formed at the left side of the semiconductor optical amplifier 31. As shown in FIG. 12, the light is output from the end face of the input/output waveguide 14-4 formed at the upper right side of the substrate 11. As an example, the reflectivity of the low reflection coating is set at a few % and that of the high reflection coating is set at 90% or above.

Figure 13:
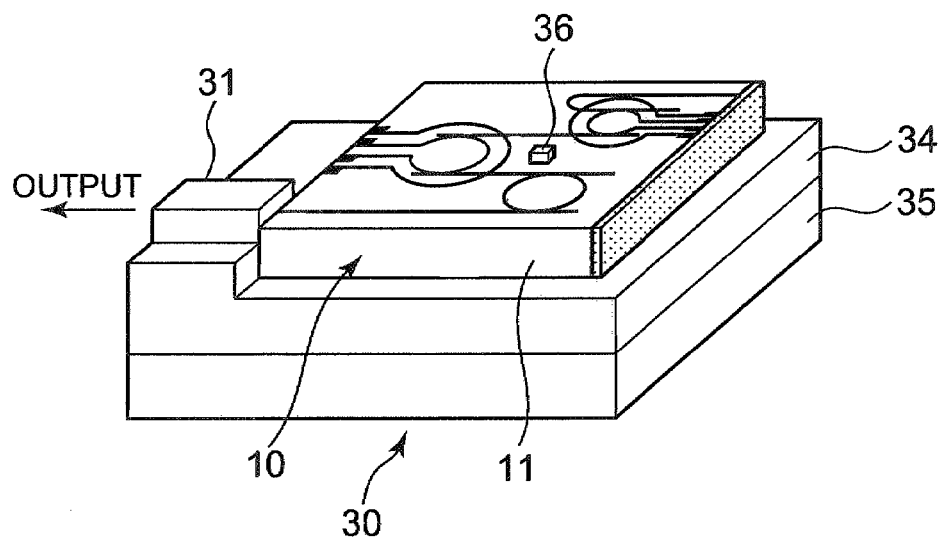
FIG. 13 is a perspective view of the wavelength variable light source according to the second exemplary embodiment of the present invention.

FIG. 13 shows a perspective view of the wavelength variable light source 30 according to the second exemplary embodiment of the present invention. At the rear surface of the substrate 34 is provided a peltier element 35 used for controlling temperatures. On the front surface of the substrate 11 is disposed a thermistor 36. The temperature of the substrate 34 is controlled to be around room temperature by the thermistor 36 and the peltier 35.

The material and the structure of the wavelength variable light source 30 according to this second exemplary embodiment are the same as those in the first exemplary embodiment. Thus, the description for the components for which the same reference numerals are used as those in the first exemplary embodiment will be omitted here. The substrate 34 is made of, for example, silicon. The semiconductor optical amplifier 31 is, for example, a semiconductor laser diode (LD), or the like. The high reflection coating 32 is formed by, for example, a gold evaporation process or the like. The low reflection coating 33 is, for example, a dielectric multi-layer film.

Next, an operation of the wavelength variable light source 30 according to the second exemplary embodiment of the present invention is described. Consistent with this exemplary embodiment, a wavelength tunable filter is used to compose an external resonator with respect to the semiconductor optical amplifier 31. A light emitted from the semiconductor optical amplifier 31 has many wavelengths. The light from the semiconductor optical amplifier 31 is inputted into a waveguide from the input/output waveguide 14-1, and then the light passes through each of the ring resonators 12-1, 12-2 and 12-3 just like the first exemplary embodiment described above. Each time the light passes a ring resonator, a resonant wavelength is selected and the light reaches the upper right side of the substrate 11 through the input/output waveguide 14-4. According to this second exemplary embodiment, the light is reflected by a high reflection coating 32 and returned through the same route into the semiconductor optical amplifier 31 from the input/output waveguide 14-1. The light is reflected partially by the low reflection coating 33 of the semiconductor optical amplifier 31 and such reflected light is returned again into the waveguide. Because an external resonator is provided in such a manner, the light is strengthened with resonance, then output from the left end surface of the semiconductor optical amplifier 31. Because such resonance is the same as that described with respect to the first exemplary embodiment, the description thereof is omitted here. In this wavelength tunable light source 30, as the light is reflected and passed through a plurality of ring resonators, the resonance effect becomes greater. According to this second exemplary embodiment, the ring resonator 12-2 is provided with a heater 15-1 and a dummy heater 16-1 that function differentially, and the ring resonator 12-3 is provided with a heater 15-2 and a dummy heater 16-2 that function differentially. The heating operations of the heaters 15-1 and 15-2 and dummy heaters 16-1 and 16-3 are the same as those in the first exemplary embodiment and, accordingly, the description thereof is omitted here.

The peltier 35 and the thermistor 36 function together to keep the temperature of the substrate 34 constant, and thereby the temperatures of the semiconductor optical amplifier 31 and the substrate 11 are maintained substantially constant. According to this exemplary embodiment, as described with respect to the first exemplary embodiment, dummy heaters 16-1 and 16-2, which work differentially with their corresponding heaters are provided, respectively, so that the temperature of the substrate 11 is maintained substantially constant even when power supply to each heater changes due to a wavelength tuning operation. Consequently, the driving condition of the peltier 35, which is provided to maintain the temperature of the substrate 11, does not change. The wavelength tuning speed can thus be reduced, for example reduced to an order of 0.1 seconds (at longest, within one second), which allows for quick wavelength tuning.

The insulation groove 19 may be formed between the heater 15-1 and the dummy heater 16-1 and may be formed between the heater 15-2 and the dummy heater 16-2. However, the insulation groove 19 may also be formed around the heaters 15-1 and 15-2 and the dummy heaters 16-1 and 16-2, respectively. Furthermore, the insulation groove 19 may also be formed anywhere on the substrate except for places where waveguides, heaters, and dummy heaters are formed.

Next, effects of the wavelength variable light source 30 according to the second exemplary embodiment of the present invention are described. As described above, in the wavelength tunable light source 30 according to this second exemplary embodiment, the driving condition of the peltier element 35 does not change, even at the time of wavelength tuning. Consequently, the wavelength variable light source 30 according to this second exemplary embodiment not only has the effects of the first exemplary embodiment described above, but it also has another effect for shortening the required time until the peltier is stabilized, thereby enabling quick wavelength tuning.

Third Exemplary Embodiment

Figure 14:
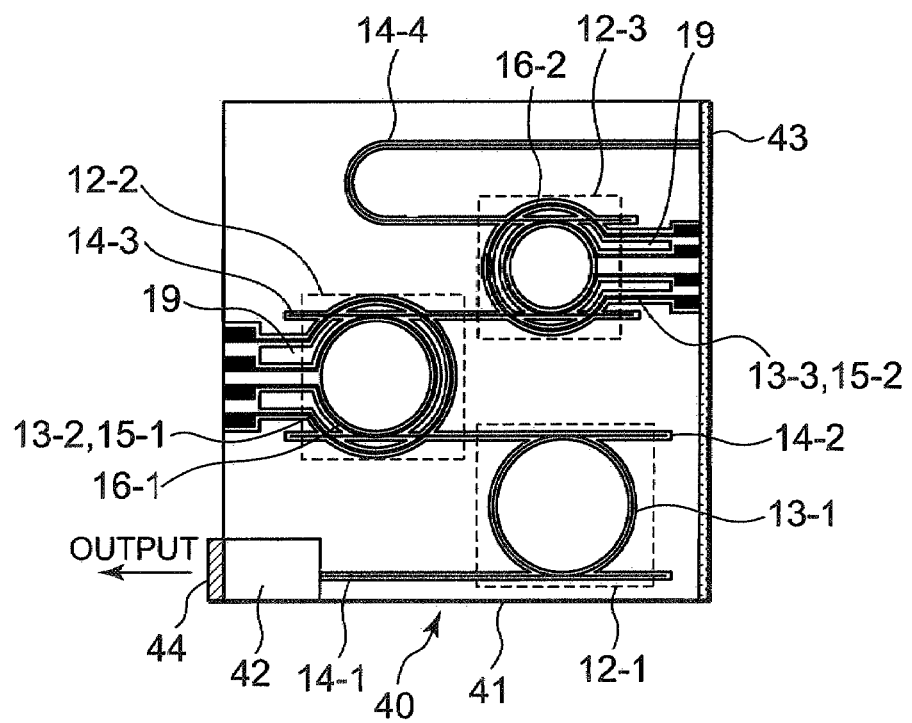
FIG. 14 is a top view of a wavelength variable light source according to a third exemplary embodiment of the present invention.

Hereunder, a structure of a wavelength tunable light source according to a third exemplary embodiment of the present invention is described. FIG. 14 shows a top view of the wavelength tunable light source 40 according to this third exemplary embodiment. In FIG. 14, the same reference numerals are used for the same components as those in the second exemplary embodiment, thereby avoiding redundancy. The wavelength tunable light source 40 according to this third exemplary embodiment is provided with the substrate 41; no other substrate is provided. A semiconductor optical amplifier 42 is mounted on the substrate 41 and this is a difference from the structure according to the second exemplary embodiment. At the left end surface of the semiconductor optical amplifier 42, a low reflection coating 44 is formed, just like the second exemplary embodiment. The semiconductor optical amplifier 42 and the input/output waveguide 14-1 are directly coupled with each other (i.e., Butt-coupled). The high reflection coating 43 and the low reflection coating 44 are disposed just like the second exemplary embodiment discussed above, but their locations may be exchanged.

Figure 15:
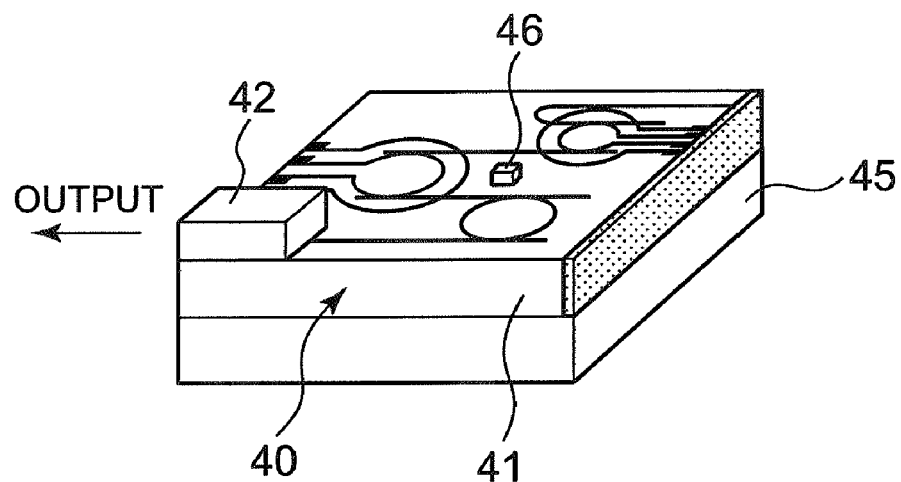
FIG. 15 is a perspective view of the wavelength variable light source according to the third exemplary embodiment of the present invention.

FIG. 15 shows a perspective view of the wavelength tunable light source 40 according to the third exemplary embodiment of the present invention. On the rear surface of the substrate 41 is provided a peltier 45. The temperature of the substrate 41 is controlled to be around room temperature by the thermistor 46 and the peltier 45.

The materials, the resonant operations, and the wavelength tuning operations of the wavelength tunable light source 40 are the same as those discussed above with respect to the second exemplary embodiment, so the description thereof is omitted here. Unlike the second exemplary embodiment, the semiconductor optical amplifier 42 is mounted on the surface of the substrate 41 according to this third exemplary embodiment. Consequently, the surfaces of the substrate 41 and the semiconductor optical amplifier 42 may be marked, respectively, in advance and the semiconductor optical amplifier 42 may be mounted on the substrate 41 in a passive alignment process. If the substrate 41 is made of a high heat conductivity material, for example, silicon, the substrate 41 can also function as a heat sink of the semiconductor optical amplifier 42.

Next, effects of the wavelength tunable light source 40 according to the third exemplary embodiment of the present invention are described. In the wavelength tunable light source according to this third exemplary embodiment, a semiconductor optical amplifier 42 is mounted on the substrate 41. Thus, the number of parts is reduced and the space is saved. The semiconductor optical amplifier 42 may also be mounted on the substrate 41 with a passive alignment method. If the substrate is made of a high heat conductivity material, the substrate 41 can also function as a heat sink. Therefore, according to this third exemplary embodiment, the wavelength tunable light source 40 can not only have the effects discussed above with respect to the second exemplary embodiment, but can also have other effects for realizing compact modules, improvement of productivity, and lower cost.

Fourth Exemplary Embodiment

Figure 16:
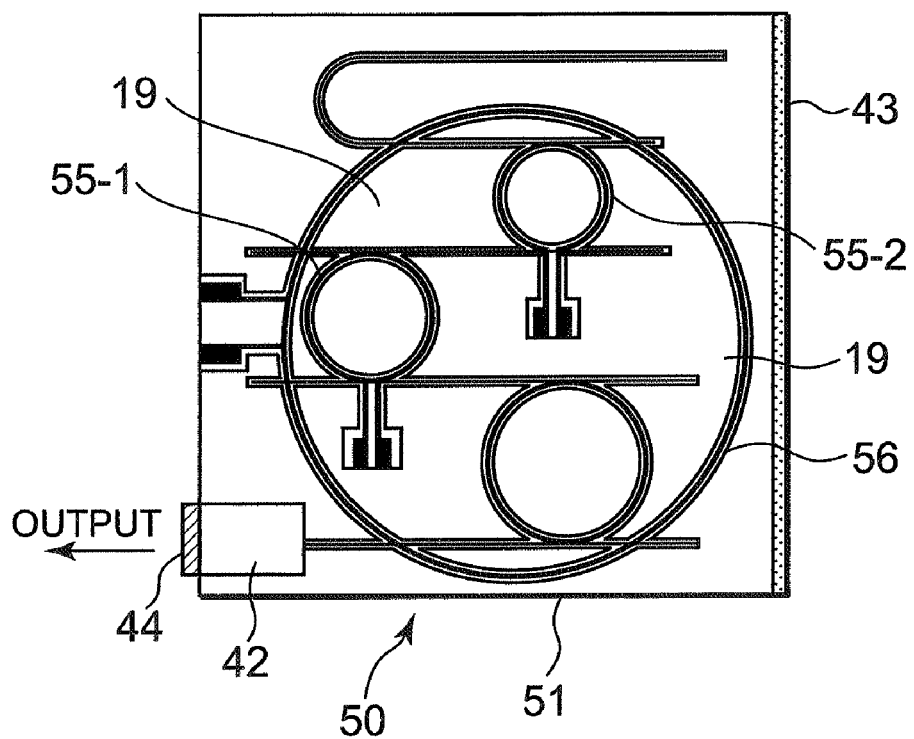
FIG. 16 is a top view of a wavelength variable light source according to a fourth exemplary embodiment of the present invention.

Hereinafter, a structure of a wavelength tunable light source according to a fourth exemplary embodiment of the present invention is described. FIG. 16 shows a top view of the wavelength variable light source 50 according to the fourth exemplary embodiment of the present invention. In FIG. 16, the same numerals are used for the same components as those in the third exemplary embodiment, thereby avoiding redundancy. In the wavelength tunable light source 50 according to this fourth exemplary embodiment, a respective dummy heater is not provided for each of the heaters 55-1 and 55-2. Rather, a dummy heater 56 is provided for a group of the heaters 55-1 and 55-2. According to this exemplary embodiment, the dummy heater 56 is formed so as to enclose each of the ring resonators.

Accordingly, one dummy heater is controlled to make differential operations as described in the expression (5) instead of the controlling method described in expressions (3) and (4) in which each ring heater is controlled independently.

$$(Ph1+Pd1) = \text{Constant} \quad (3)$$

$$(Ph2+Pd2) = \text{Constant} \quad (4)$$

$$Ph1+Ph2+Pd = \text{Constant} \quad (5)$$

Where, Ph1 is a power applied to the heater 1, Ph is a power applied to the heater 2, Pd1 is a power applied to the dummy heater 1, Pd2 is a power applied to the dummy heater 2, and Pd is a power applied to the dummy heater, which is formed so as to enclose heater 1 and heater 2, as shown in FIG. 16.

In the wavelength tunable light source 50 according to this fourth exemplary embodiment, dummy heaters are grouped into one dummy heater to simplify the controlling. Such simplified controlling will be more effective if a heater is provided for every ring resonator or if many ring resonators are provided particularly. According to this exemplary embodiment, a dummy heater is formed so as to enclose the ring heaters, and thereby the slope of the temperature in the substrate 51 can be made more constant.

Fifth Exemplary Embodiment

Figure 17:
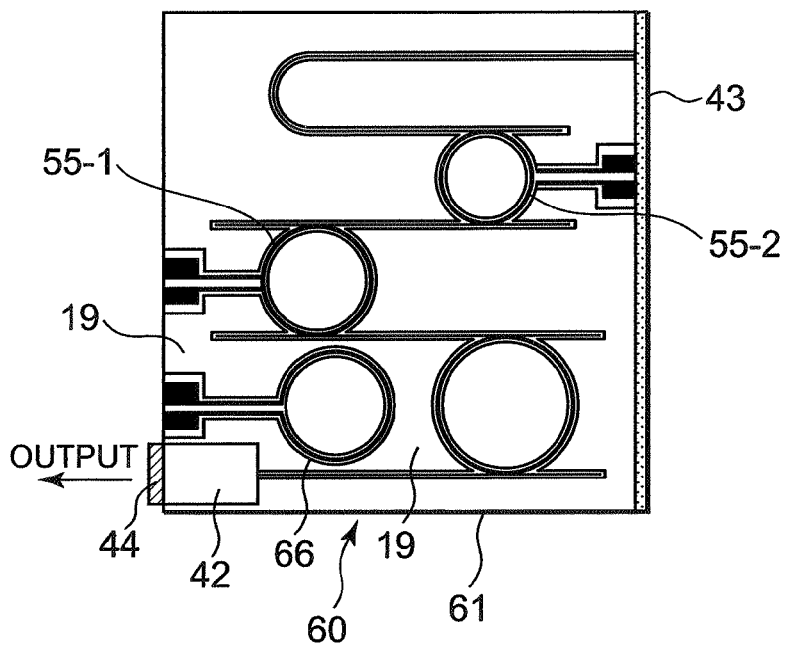
FIG. 17 is a top view of a wavelength variable light source according to a fifth exemplary embodiment of the present invention.

Hereinafter, a structure of a wavelength tunable light source according to a fifth exemplary embodiment of the present invention is described. FIG. 17 shows a top view of the wavelength tunable light source according to this fifth exemplary embodiment of the present invention. In FIG. 17, the same reference numerals are used for the same components as those in the third exemplary embodiment, thereby avoiding redundancy. The wavelength tunable light source 60 according to this fifth exemplary embodiment is different from that in the fourth exemplary embodiment in that a dummy heater 66 is provided in a free space of the substrate 61.

Also, in the wavelength tunable light source 60 according to this fifth exemplary embodiment, dummy heaters are grouped into one to simplify the controlling. Such simplified controlling is more effective if a heater is provided for every ring resonator or if many ring resonators are provided particularly. If the temperature slope of the substrate 61 does not matter, a dummy heater may be provided in a free space of the substrate so as to thereby make good use of the space.

Sixth Exemplary Embodiment

Figure 18:
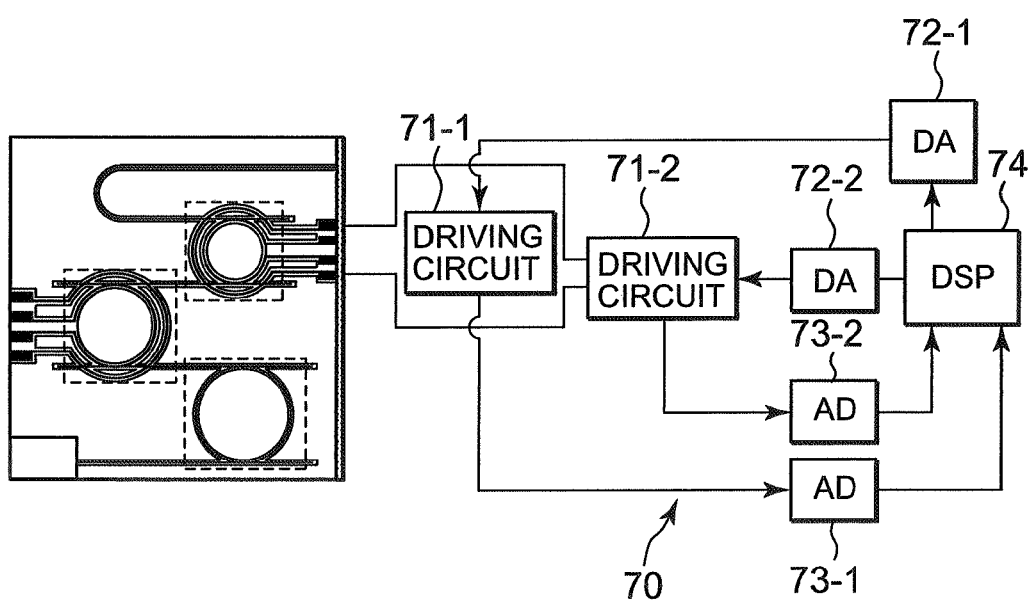
FIG. 18 is a block diagram of a controlling circuit according to a sixth exemplary embodiment of the present invention.

Next, a controlling circuit of a variable light controlling device of a sixth exemplary embodiment of the present invention is described. FIG. 18 shows a block diagram of the controlling circuit of the tunable light controlling device according to an exemplary embodiment of the present invention. In this exemplary embodiment, the wavelength variable light source according to the third exemplary embodiment is shown as an example. However, any other light source in any other of the exemplary embodiments described herein (i.e., the first, second, third, fourth, fifth and seventh exemplary embodiments) may be selected as an object to be controlled here. The controlling circuit 70 is provided for each resonator independently, and the control circuit 70 is provided with driving circuits 71-1 and 71-2, Digital/Analog (DA) converters 72-1 and 72-2, Analog/Digital (AD) converters 73-1 and 73-2, and a Digital Signal Processor (DSP) 74.

The controlling circuit 70 is controlled by the DSP 74. Each of the DA converters 72-1 and 72-2 converts digital signals received from the DSP 74 to analog signals, and then sends the converted analog signals to each of the driving circuits 71-1 and 71-2. Each of the AD converters 73-1 and 73-2 converts analog signals received from the driving circuits 71-1 and 71-2 to digital signals, and then sends the converted digital signals to the DSP 74. The driving circuit 71-1 drives the heaters and the driving circuit 71-2 drives the dummy heaters.

As shown in FIG. 18, a controlling circuit is provided for each resonator. However, only one DSP may also control a plurality of resonators consistent with the present invention. Like the fourth or fifth exemplary embodiments, discussed above, a common dummy heater can be provided, and the common dummy heater can be controlled by one controlling circuit (i.e., a dummy heater is not provided for each resonator).

Seventh Exemplary Embodiment

Figure 19:
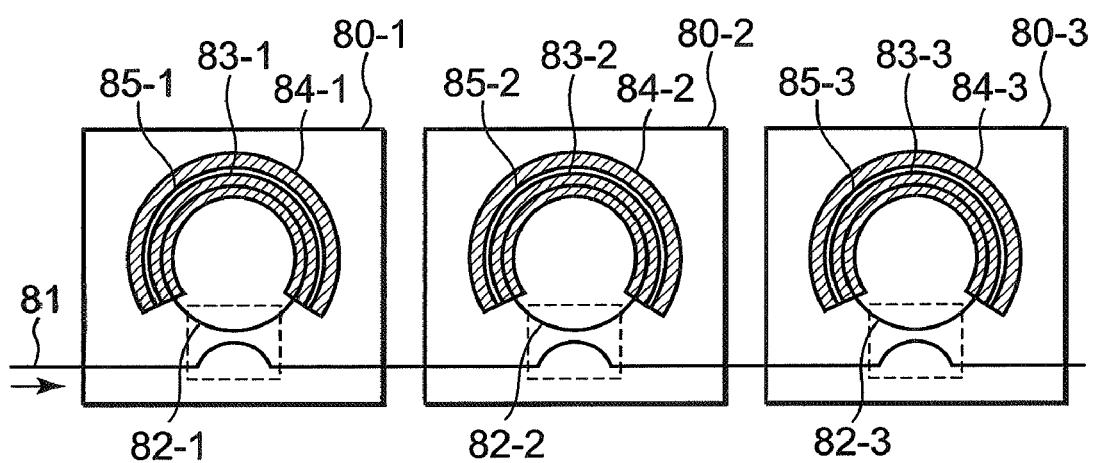
FIG. 19 is a top view of a variable dispersion compensator according to a seventh exemplary embodiment of the present invention.

Hereinafter, another exemplary embodiment of the present invention is described. FIG. 19 shows a top view of a variable dispersion compensator consistent with the present invention. This variable dispersion compensator is structured so that resonators 80-1, 80-2 and 80-3 are connected serially along a common linear waveguide 81. An optical coupler is formed at each place where the linear waveguide 81 gets close to one of the ring waveguides 82-1, 82-2 and 82-3. As shown in FIG. 19, each of the optical couplers functions as a directional coupler. Besides the directional coupler, the optical coupler may be, for example, a multi-mode interferometer, a Mach-Zehnder type interferometer, or the like. A delay time spectrum from each resonator is synthesized through the serial coupling so that a synthesized spectrum is formed. A dispersion compensation amount is determined according to the slope of this synthesized spectrum. In each resonator, the central wavelength of the delay time spectrum is shifted when the heaters 83-1, 83-2 and 83-3 are powered. Consequently, the slope degree of the synthesized spectrum changes. And, the dispersion compensation amount changes according to the slope degree. Accordingly, the dispersion compensation amount can be controlled by controlling the power applied to the object heaters. Each of the dummy heaters 84-1, 84-2 and 84-3 receives a difference of power so as to compensate for a change of the power supplied to its corresponding heater (83-1, 83-2 or 83-3). As such, the substrate is protected entirely from temperature changes. Disposition and structure of the heaters and dummy heaters, as well as how to control those heaters and dummy heaters according to this exemplary embodiment are all the same as those discussed above with respect to the above described exemplary embodiments. Each heater is disposed on a ring waveguide and each dummy heater is disposed separately from the corresponding heater. Furthermore, an insulation groove (any of 85-1, 85-2 and 85-3) is provided between each heater and its corresponding dummy heater. Thus, the present invention can be applied to any other optical devices that use the thermo-optic effects.

While exemplary embodiments of the present invention have been described above, it is to be understood that numerous modifications to the exemplary embodiments of the invention will be apparent to those skilled in the art without departing from the spirit and scope of the embodiments of the present invention as defined in the following claims.

What is claimed is:

1. A variable light controlling device, comprising:
    a substrate;
    an optical waveguide disposed on said substrate;
    a first heater disposed near said optical waveguide; and
    a second heater disposed separately from said first heater,
    wherein a total amount of power supplied to both of said first and second heaters is maintained substantially constant,
    wherein said first heater is disposed on a first clad in which a core is formed, and
    wherein said second heater is disposed on a second clad in which no core is formed.

2. A variable light controlling device, comprising:
    a substrate;
    an optical waveguide disposed on said substrate;
    a first heater disposed near said optical waveguide; and
    a second heater disposed separately from said first heater,
    wherein a total amount of power supplied to both of said first and second heaters is maintained substantially constant,
    wherein said optical waveguide is configured to form at least one resonator,
    wherein said at least one resonator comprises a ring resonator, and
    wherein said first heater is disposed so as to substantially cover a circumference of said ring resonator.

3. A variable light controlling device, comprising:
    a substrate;
    an optical waveguide disposed on said substrate;
    a first heater disposed near said optical waveguide; and
    a second heater disposed separately from said first heater,
    wherein a total amount of heat emitted from both of said first and second heaters is maintained substantially constant,
    wherein said first heater is disposed on a first clad in which a core is formed, and
    wherein said second heater is disposed on a second clad in which no core is formed.

4. A variable light controlling device, comprising:
    a substrate;
    an optical waveguide disposed on said substrate;
    a first heater disposed near said optical waveguide; and
    a second heater disposed separately from said first heater,
    wherein a total amount of heat emitted from both of said first and second heaters is maintained substantially constant,
    wherein said optical waveguide is configured to form at least one resonator,
    wherein said at least one resonator comprises a ring resonator, and
    wherein said first heater is disposed so as to substantially cover a circumference of said ring resonator.

* * * * *